(12) United States Patent
Voelkel

(10) Patent No.: US 7,742,325 B2
(45) Date of Patent: Jun. 22, 2010

(54) SWAPPED-BODY RAM ARCHITECTURE

(75) Inventor: Eric H. Voelkel, Ben Lomond, CA (US)

(73) Assignee: SuVolta, Inc., Los Gatos, CA (US)

( * ) Notice: Subject to any disclaimer, the term of this patent is extended or adjusted under 35 U.S.C. 154(b) by 28 days.

(21) Appl. No.: 11/958,032

(22) Filed: Dec. 17, 2007

(65) Prior Publication Data

US 2009/0154259 A1 Jun. 18, 2009

(51) Int. Cl.
*G11C 11/00* (2006.01)
*G11C 8/00* (2006.01)

(52) U.S. Cl. ............... 365/154; 365/156; 365/189.09; 365/226; 365/227; 365/228; 365/229

(58) Field of Classification Search ............... 365/154, 365/156, 185.18, 189.09, 226, 227, 228, 365/229; 327/407
See application file for complete search history.

(56) References Cited

U.S. PATENT DOCUMENTS

| | | | | |
|---|---|---|---|---|
| 5,319,604 A * | 6/1994 | Imondi et al. | ........... | 365/185.18 |
| 5,570,312 A | 10/1996 | Fu | ............... | 365/154 |
| 5,706,226 A * | 1/1998 | Chan et al. | ............... | 365/154 |
| 5,793,671 A | 8/1998 | Selcuk | ............... | 365/154 |
| 5,858,826 A | 1/1999 | Lee et al. | ............... | 438/228 |
| 5,986,924 A * | 11/1999 | Yamada | ............... | 365/154 |
| 6,198,670 B1 | 3/2001 | Marr | ............... | 365/189.09 |
| 6,496,422 B2 | 12/2002 | Marr | ............... | 365/189.09 |
| 6,529,400 B1 * | 3/2003 | Bhavnagarwala et al. | ... | 365/154 |
| 6,590,800 B2 * | 7/2003 | Chang | ............... | 365/154 |
| 6,621,325 B2 | 9/2003 | Hart et al. | ............... | 327/534 |
| 6,876,040 B1 | 4/2005 | Wann et al. | ............... | 257/351 |
| 7,177,176 B2 * | 2/2007 | Zheng et al. | ............... | 365/154 |
| 7,313,021 B2 * | 12/2007 | Horiuchi | ............... | 365/154 |
| 7,378,897 B2 * | 5/2008 | Hopkins | ............... | 327/407 |
| 7,428,164 B2 * | 9/2008 | Yamaoka et al. | ............... | 365/156 |
| 2004/0252548 A1 | 12/2004 | Tsukamoto et al. | ......... | 365/154 |
| 2006/0006479 A1 | 1/2006 | Kapoor | ............... | 257/393 |
| 2007/0076467 A1 | 4/2007 | Yamaoka et al. | ............... | 365/154 |
| 2008/0308816 A1 | 12/2008 | Miller et al. | ............... | 257/76 |

OTHER PUBLICATIONS

*PCT Notification of Transmittal of the International Search Report and the Written Opinion of the International Searching Authority* for International Application No. PCT/US2008/083531; 13 pages, Feb. 16, 2009.

* cited by examiner

*Primary Examiner*—Trong Phan
(74) *Attorney, Agent, or Firm*—Baker Botts L.L.P.

(57) ABSTRACT

A method for operating an SRAM cell comprises, during a read operation, forward biasing an N-well of a first and second pull-up transistor, and forward biasing a P-well of a first and second pull-down transistor and a first and second access transistor. The method further comprises, during a write operation, zero or reverse biasing an N-well of a first and second pull-up transistor, and forward biasing a P-well of a first and second pull-down transistor and a first and second access transistor. The method further comprises, during an idle state, zero biasing an N-well of a first and second pull-up transistor and zero biasing a P-well of a first and second pull-down transistor and a first and second access transistor. In addition, one or more rows or columns of memory cells may receive a bias voltage.

14 Claims, 2 Drawing Sheets

SWAPPED-BODY RAM ARCHITECTURE

TECHNICAL FIELD

This disclosure relates in general to electronic circuits, and more particularly to a swapped-body RAM architecture.

OVERVIEW

In memory cell design it is often desirable to have high performance during normal operation and robust read operation, along with low leakage and low operating voltages. However, high performance and robust read operation is often achieved at the expense of higher leakage and higher minimum operating voltages. To mitigate this, sleep modes can be introduced that may be effective at reducing leakage and voltage. However, normal memory operation is precluded while in a sleep mode.

SUMMARY OF EXAMPLE EMBODIMENTS

In accordance with one embodiment of the present disclosure, a memory cell comprises first and second access transistors, wherein the first access transistor is connected to a word line and connected between a first bit line and a first data node, and wherein the second access transistor is connected to the word line and connected between a second bit line and a second data node. The cell further comprises first and second pull-up transistors, wherein the first pull-up transistor is connected to a first power supply point and to the first data node, and wherein the second pull-up transistor is connected to the first power supply point and the second data node. The cell further comprises first and second pull-down transistors, wherein the first pull-down transistor is connected to a second power supply point and to the first data node, and wherein the second pull-down transistor is connected to the second power supply point and to the second data node. The memory cell can perform a read operation, a write operation, or reside in an idle state. During a read operation, the first and second pull-up transistors, the first and second pull-down transistors, and the first and second access transistors receive a forward bias voltage. During a write operation the first and second pull-up transistors receive a zero (or reverse) bias voltage, and the first and second pull-down transistors and the first and second access transistors receive a forward bias voltage. When residing in an idle state the first and second pull-up transistors, the first and second pull-down transistors, and the first and second access transistors receive a zero (or reverse) bias voltage. In some embodiments, during a read, write, or idle operation one or more rows or columns of memory cells may receive a bias voltage.

In accordance with another embodiment of the present disclosure, a method for operating an SRAM cell comprises, during a read operation, forward biasing an N-well of a first and second pull-up transistor, and forward biasing a P-well of a first and second pull-down transistor and a first and second access transistor. The method further comprises, during a write operation, zero (or reverse) biasing an N-well of a first and second pull-up transistor, and forward biasing a P-well of a first and second pull-down transistor and a first and second access transistor. The method further comprises, during an idle state, zero biasing an N-well of a first and second pull-up transistor and zero biasing a P-well of a first and second pull-down transistor and a first and second access transistor. In some embodiments, during a read, write, or idle operation one or more rows or columns of memory cells may receive a bias voltage.

Important technical advantages of certain embodiments of the present disclosure include the ability to have high performance during normal operation, combined with low leakage, low operating voltage, and robust read operations.

Other important technical advantages of certain embodiments of the present disclosure include the ability to bias only selected rows or columns of a memory cell array, providing further power savings.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION

A memory cell, such as a six-transistor SRAM cell, can be created using transistors that have lower leakage and drive currents while in a "default" state. To achieve high performance when needed, the memory cells can be appropriately forward biased during operation. A memory cell can achieve this by using transistors that are formed in wells so that the wells can be biased to improve performance of the cell or reduce leakage, while also providing robust cell operation.

Figure 1:
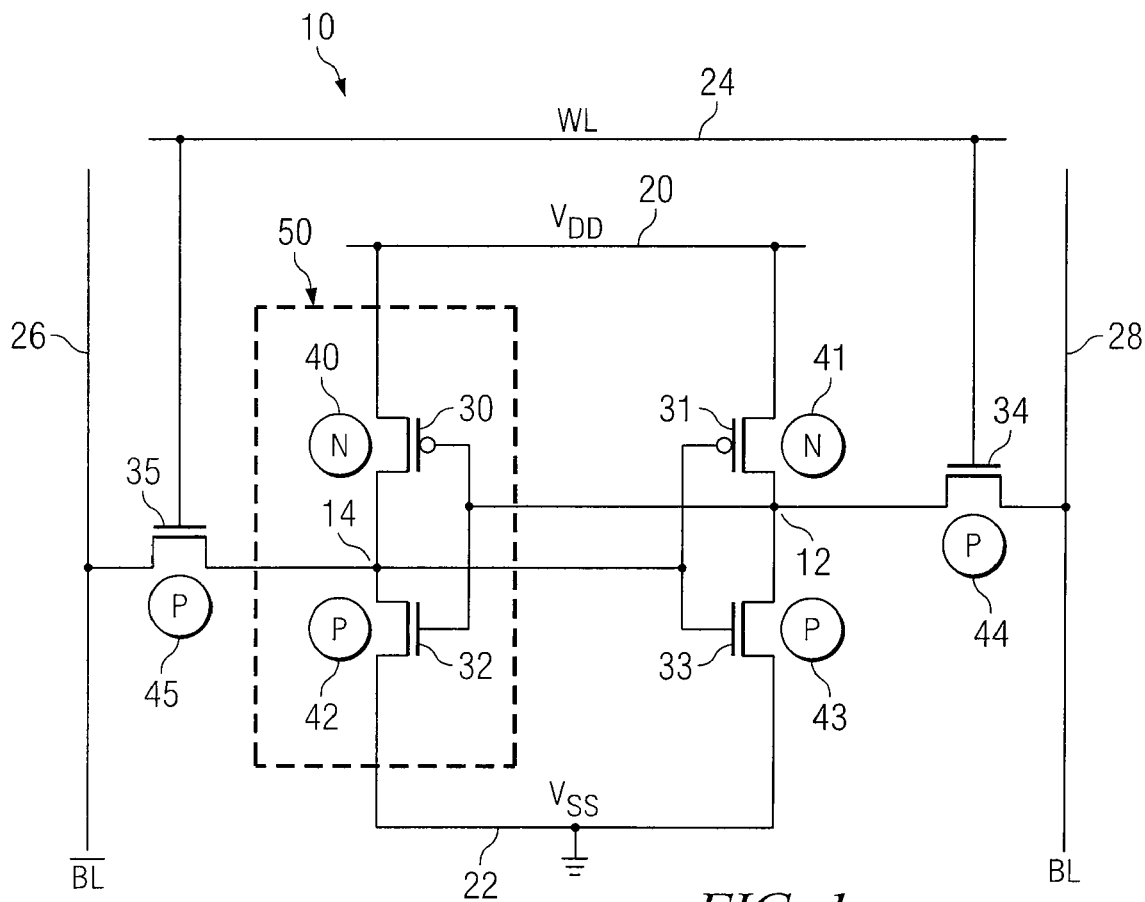
FIG. 1 illustrates one embodiment of a biased SRAM architecture.

FIG. 1 illustrates a memory cell 10 comprised of six transistors. Certain embodiments of this disclosure may comprise a cell with more than six transistors. Any suitable number or combination of transistors in a memory cell falls within the scope of the disclosed embodiments. Transistors 30, 31, 32, and 33 store data bits in memory cell 10. Transistors 30 and 31 can be referred to as "pull-up" transistors. Transistors 32 and 33 can be referred to as "pull-down" transistors. Transistors 34 and 35 control access to transistors 30, 31, 32, and 33 during read and write operations of memory cell 10. Accordingly, transistors 34 and 35 can be referred to as "access" transistors. Although not shown in FIG. 1, certain embodiments of this disclosure may contain more than two access transistors. Data in memory cell 10 is stored at nodes 12 and 14. When a logical 1 is stored in memory cell 10, node 12 is at a high voltage (also known as a logical 1), and node 14 is at a low voltage (also known as a logical 0). When a logical 0 is stored in memory cell 10, the opposite situation occurs and node 12 is at a low voltage and node 14 is at a high voltage. Word line 24 and two bit lines, BL 28 and $\overline{BL}$ 26, control access to memory cell 10 and are used in read and write operations, as described in further detail below.

Transistors 30-35 in memory cell 10 can comprise any suitable type of transistor. As one example, in certain embodiments transistors 30-35 comprise CMOS-type transistors. As another example, transistors 30-35 may comprise JFET-type transistors. In some non-limiting embodiments, transistors 30 and 31 can be P-type transistors that are formed in an N-type well. Meanwhile, transistors 32-35 can be N-type transistors that are formed in a P-type well, which is further surrounded by an N-type well. In other embodiments, transistors 30 and 31 could be N-type, formed in a P-type well, while transistors 32-35 could be P-type, formed in an N-type well.

Memory cell 10 can be designed to achieve high performance, low power consumption, and stable read operation by using transistors that are formed in wells that are biased during the various operations of memory cell 10. The basic operating states of an SRAM memory cell, like memory cell 10, are discussed first below. That is followed by descriptions of certain embodiments of memory cell 10 comprised of transistors formed in wells that are biased using bias points to achieve improved operation of memory cell 10.

In basic operation, access to an SRAM memory cell, like memory cell 10, is controlled by word line 24. Word line 24 can control access to more than one memory cell; i.e., when word line 24 is activated multiple cells can be written to or read from at the same time. Word line 24 controls access to memory cell 10 by controlling two access transistors 34 and 35. When word line 24 is not enabled, access transistors 34 and 35 disconnect memory cell 10 from BL 28 and $\overline{BL}$ 26. Pull-up transistors 30 and 31 and pull-down transistors 32 and 33 reinforce each other in this state and preserve the data bits stored at nodes 12 and 14.

To access memory cell 10 for read or write operations, word line 24 is enabled. In certain embodiments, word line 24 is enabled by raising it to voltage Vdd. When this occurs, the voltage at word line 24 turns on access transistors 34 and 35, providing BL 28 and $\overline{BL}$ 26 access to memory cell 10. The voltage values of BL 28 and $\overline{BL}$ 26 determine whether the data in memory cell 10 is read, or whether data is written to memory cell 10.

When data is read from memory cell 10, BL 28 and $\overline{BL}$ 26 are first charged to a high voltage. In certain embodiments, this means raising the voltage value on BL 28 and $\overline{BL}$ 26 to Vdd. Then word line 24 is enabled, which enables access transistors 34 and 35 and provides BL 28 and $\overline{BL}$ 26 access to memory cell 10. The values stored at nodes 12 and 14 are then transferred to BL 28 and $\overline{BL}$ 26, respectively. For example, if the cell is storing a logical 1, there is a high voltage at node 12, and access transistor 34 and pull-up transistor 31 will reinforce Vdd on BL 28 (a high voltage and a logical 1). On the other side of memory cell 10, access transistor 35 and pull-down transistor 32 pull $\overline{BL}$ 26 towards the low voltage at node 22 (Vss), which corresponds to a logical 0. Conversely, if the cell is storing a low voltage (logical 0) at node 12, access transistor 34 and pull-down transistor 33 pull BL 28 down toward the low voltage at node 22 (Vss). On the other side, access transistor 35 and pull-up transistor 30 will reinforce Vdd on $\overline{BL}$ 26 (a high voltage and a logical 1). During a read operation, the contents of memory cell 10 are thus transferred to BL 28 and $\overline{BL}$ 26. Further, during a read operation, the values stored at nodes 12 and 14 are not disturbed. After the read operation, when word line 24 is no longer asserted, access transistors 35 and 36 again disconnect memory cell 10 from BL 28 and $\overline{BL}$ 26, and the data bits stored at nodes 12 and 14 are preserved.

To write data to memory cell 10, the write cycle begins by applying the value to be written to BL 28 and $\overline{BL}$ 26. For example, if a logical 0 needs to be written to memory cell 10, BL 28 is set to a low voltage (logical 0) and $\overline{BL}$ 26 is set to a high voltage (logical 1). Word line 24 is then asserted and access transistors 34 and 35 provide BL 28 and $\overline{BL}$ 26 access to memory cell 10. The voltage values stored on BL 28 and $\overline{BL}$ 26 are driven into memory cell 10, overriding the previous states stored at nodes 12 and 14. Memory cell 10 stabilizes at its new state. Word line 24 can then be turned off, causing access transistors 34 and 35 to disconnect BL 28 and $\overline{BL}$ 26 from memory cell 10. The new value is thus stored in memory cell 10. If a logical 1 needs to be written to memory cell 10, BL 28 is set to a high voltage (logical 1) and $\overline{BL}$ 26 is set to a low voltage (logical 0), and a similar write process occurs as described above.

In certain embodiments, the characteristics of transistors 30-35 can be altered to improve the performance of memory cell 10 during the various operations. This can be accomplished by applying voltages to the wells in which the transistors are formed in order to alter the characteristics of the transistor; in other words, biasing the wells. The wells can be biased differently based on the operation that is being performed on memory cell 10. As one example, during read operations, it can be advantageous for memory cell 10 to be stable and easily accessed. Stability of memory cell 10 means that the value stored in memory cell 10 will not be altered during a read operation. Therefore, access transistors 34 and 35 should not be too strong relative to pull-down transistors 32 and 33. During read operations, it can also be advantageous for the pull-up transistors 30 and 31 to be strong in order to keep nodes 12 and 14 stable. For read speed, access transistors 34 and 35 and pull-down transistors 32 and 33 should have high drive current; but for read stability access transistors 34 and 35 should have low drive current relative to pull-down transistors 32 and 33, so the state of memory cell 10 is not flipped to a new value.

During write operations, it can be advantageous for pull-up transistors 30 and 31 to be weak so that it is easier to flip them to the new state; this can help to drive a new logical value to memory cell 10. Also, access transistors 34 and 35 can have high drive current to more easily flip the state of memory cell 10.

During idle operations, when data is not being written to or being read from memory cell 10, it can be advantageous to preserve the state of memory cell 10 at low power.

One technique for creating these transistor characteristics during the various operations is to build the transistors so that they reside within easily bias-able, relatively independent wells. With the use of a multi-well process and/or certain transistor layout techniques, the characteristics of the transistors can be altered during the various operations by applying one or more bias voltages to one or more of the wells.

As shown in FIG. 1, well configuration 50 could comprise a P-type transistor 30 residing in an N-well 40, and an N-type transistor 32 residing in a P-well 42. FIGS. 2-5 illustrate examples of well configurations 50A-50D that can be used for biasing transistors in memory cell 10, and improving the performance of memory cell 10 during the various operations. For simplicity, only two transistors are highlighted in FIGS. 1-5; however, any suitable number of transistors can be placed in a particular well. Furthermore, rows and/or columns of transistors can be placed in a particular well so that the biasing techniques can be applied to only a particular row or a particular column in a memory cell array.

Figure 2:
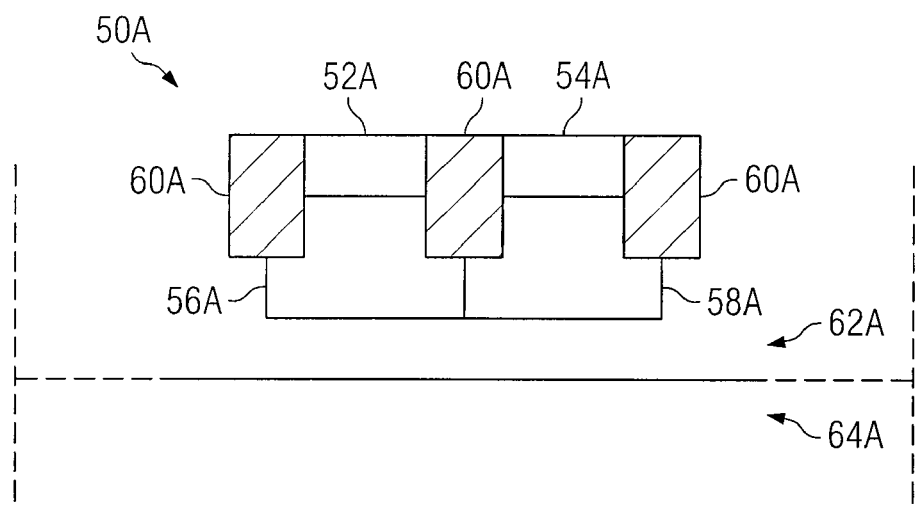
FIG. 2 illustrates one embodiment of a well structure for transistors used in the SRAM architecture of FIG. 1.

FIG. 2 illustrates one example configuration for a triple-well structure 50A. Triple-well structure 50A comprises N-channel transistor 52A and P-channel transistor 54A. Transistors 52A and 54A can be any suitable type of transistor; in certain embodiments, transistors 52A and 54A are JFET devices. Triple-well structure 50A can comprise any suitable number or type of transistors; triple-well structure 50A does not have to comprise one N-type and one P-type transistor.

For example, triple-well structure 50A could comprise rows and/or columns of transistors residing within a particular well, so that biasing techniques can be applied to a particular row or a particular column in a memory cell array.

Triple-well structure 50A comprises insulating material 60A. Insulating material 60A can be any suitable type of insulating material; for example, oxide. Insulating material 60A may be used to electrically isolate various parts of triple-well structure 50A.

Triple-well structure 50A also comprises P-well 56A. N-channel transistor 52A may reside in P-well 56A. In certain other embodiments, P-well 56A could contain more than one N-type transistor. Triple-well structure 50A also comprises N-well 58A. One or more P-channel transistors, like P-channel transistor 54A, can reside in N-well 58A.

Triple-well structure 50A also comprises deep N-well 62A. Deep N-well 62A may contain one or more P-wells 56A and/or N-wells 58A. Deep N-well 62A may reside within a P-type substrate 64A. P-type substrate may contain more than one deep N-well 62A.

To bias one or more of the N-channel transistors 52A or the P-channel transistors 54A in triple-well structure 50A, one or more bias voltages may be applied to one or more of the wells. For example, to bias one or more N-channel transistors 52A, a bias voltage could be applied to P-well 56A. A biasing scheme may also be created that allows bias voltages to be applied to multiple P-wells 56A at the same time, so that a row and/or column of N-channel transistors 52A may be biased simultaneously. Similarly, a bias voltage may be applied to an N-well 58A to bias a P-channel transistor 54A. In this example triple-well structure 50A, the presence of deep N-well 62A acts to electrically connect all N-wells 58A that are in contact with deep N-well 62A. Therefore, this configuration may not support independent biasing of each P-channel transistor 54A that may reside in one of the one or more N-wells 58A, if those N-wells are electrically connected.

Figure 3:
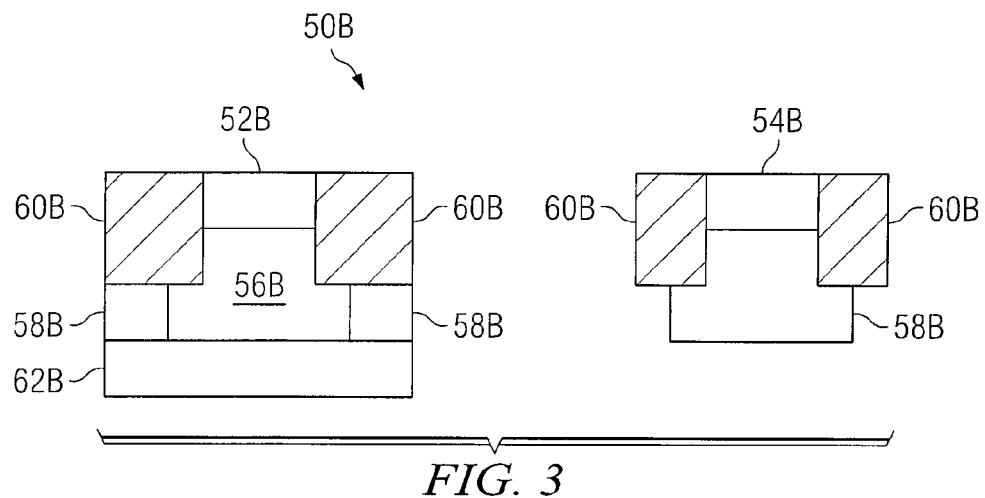
FIG. 3 illustrates another embodiment of a well structure for transistors used in the SRAM architecture of FIG. 1.

FIG. 3 illustrates another example configuration for a triple-well structure 50B. Triple-well structure 50B comprises N-channel transistor 52B and P-channel transistor 54B. Transistors 52B and 54B can be any suitable type of transistor; in certain embodiments, transistors 52B and 54B are JFET devices. Triple-well structure 50B can comprise any suitable number or type of transistors; triple-well structure 50B does not have to comprise one N-type and one P-type transistor. For example, triple-well structure 50B could comprise rows and/or columns of transistors residing within a particular well, so that biasing techniques can be applied to a particular row or a particular column in a memory cell array.

Triple-well structure 50B comprises insulating material 60B. Insulating material 60B can be any suitable type of insulating material; for example, oxide. Insulating material 60B may be used to electrically isolate various parts of triple-well structure 50B.

Triple-well structure 50B also comprises P-well 56B. N-channel transistor 52B may reside in P-well 56B. In certain other embodiments, P-well 56B could contain more than one N-type transistor. Triple-well structure 50B also comprises N-well 58B. One or more P-channel transistors, like P-channel transistor 54B, can reside in N-well 58B.

Triple-well structure 50B also comprises deep N-well 62B. Deep N-well 62B may contain one or more P-wells 56B. In this example configuration, the P-well and N-well islands are electrically isolated from other P-well and N-well islands. Because of this configuration, the wells can be biased independently, and row and/or column biasing would also be possible. However, the physical spacing between the N-well 58B that contains P-channel transistor 54B and the N-wells 58B and deep N-well 62B that contain the P-well 56B may result in a large cell area.

Figure 4:
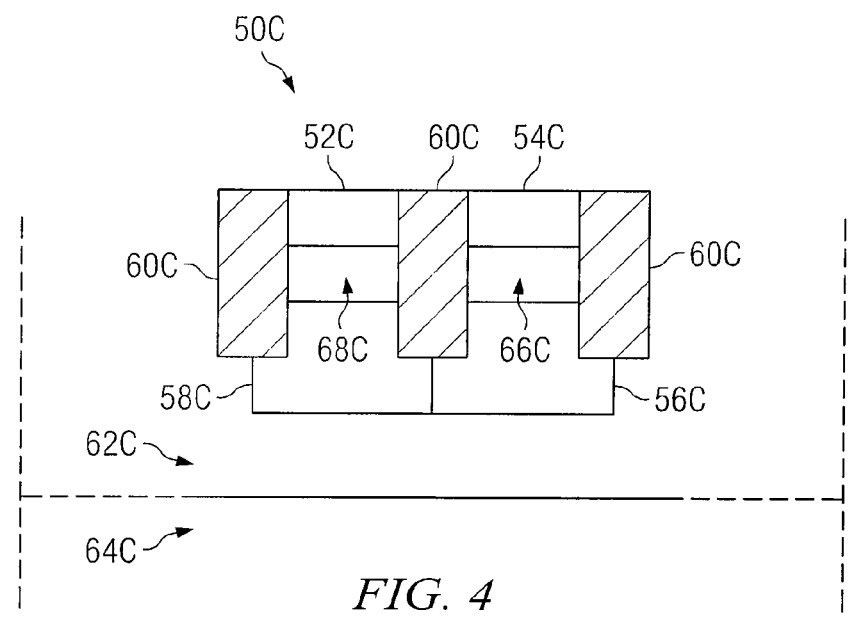
FIG. 4 illustrates another embodiment of a well structure for transistors used in the SRAM architecture of FIG. 1.

FIG. 4 illustrates another example configuration for a triple-well structure 50C. Triple-well structure 50C comprises N-channel transistor 52C and P-channel transistor 54C. Transistors 52C and 54C can be any suitable type of transistor; in certain embodiments, transistors 52C and 54C are JFET devices. Triple-well structure 50C can comprise any suitable number or type of transistors; triple-well structure 50C does not have to comprise one N-type and one P-type transistor. For example, triple-well structure 50C could comprise rows and/or columns of transistors residing within a particular well, so that biasing techniques can be applied to a particular row or a particular column in a memory cell array.

Triple-well structure 50C comprises insulating material 60C. Insulating material 60C can be any suitable type of insulating material; for example, oxide. Insulating material 60C may be used to electrically isolate various parts of triple-well structure 50C.

Triple-well structure 50C also comprises a shallow P-well 68C that can contain N-channel transistor 52C. Shallow P-well 68C does not extend below insulating material 60C. Shallow P-well 68C is thus electrically isolated from other P-wells by insulating material 60C and by N-well 58C. Triple-well structure 50C also comprises a shallow N-well 66C that can contain P-channel transistor 54C. Shallow N-well 66C also does not extend below insulating material 60C. Shallow N-well 66C is thus electrically isolated from other N-wells by insulating material 60C and by P-well 56C. This layout allows for electrical isolation in a more compact structure than other types of triple-well structures.

Triple-well structure 50C also comprises deep N-well 62C. Deep N-well 62C may contain one or more P-wells 56C and/or N-wells 58C. Deep N-well 62C may reside within a P-type substrate 64C. P-type substrate may contain more than one deep N-well 62C.

Figure 5:
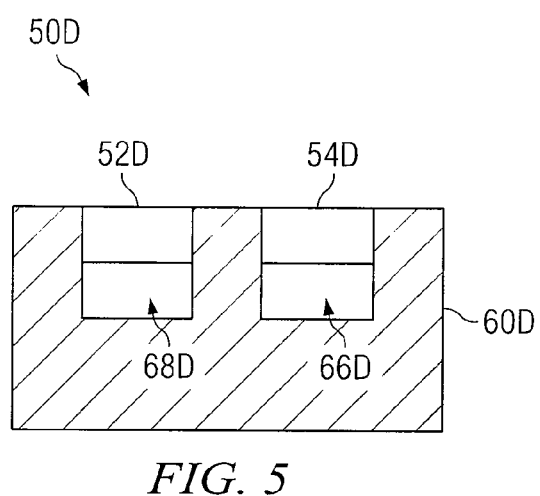
FIG. 5 illustrates another embodiment of a well structure for transistors used in the SRAM architecture of FIG. 1

FIG. 5 illustrates another example configuration for a triple-well structure 50D. Triple-well structure 50D is similar to a silicon-on-insulator (SOI) process. Triple-well structure 50D comprises N-channel transistor 52D and P-channel transistor 54D. Transistors 52D and 54D can be any suitable type of transistor; in certain embodiments, transistors 52D and 54D are JFET devices. Triple-well structure 50D can comprise any suitable number or type of transistors; triple-well structure 50D does not have to comprise one N-type and one P-type transistor. For example, triple-well structure 50D could comprise rows and/or columns of transistors residing within a particular well, so that biasing techniques can be applied to a particular row or a particular column in a memory cell array.

Triple-well structure 50D comprises insulating material 60D. Insulating material 60D can be any suitable type of insulating material; for example, oxide. Insulating material 60D may be used to electrically isolate various parts of triple-well structure 50D.

Triple-well structure 50D also comprises shallow P-well 68D. N-channel transistor 52D may reside in shallow P-well 68D. In certain other embodiments, shallow P-well 68D could contain more than one N-type transistor. Triple-well structure 50D also comprises shallow N-well 66D. One or more P-channel transistors, like P-channel transistor 54D, can reside in shallow N-well 66D. In certain embodiments, a structure like triple-well structure 50D uses insulating material 60D to completely isolate the local wells 66D and 68D. A structure like triple-well structure 50D may also use wafers with a bottom insulating layer.

One biasing scheme for improved performance of a memory cell 10 works as follows. Transistors can be selected for use in memory cell 10 that normally operate at a lower power and lower leakage. However, this sometimes results in low performance as well. To counter that, the transistors can be forward biased when they are to be accessed for read or write operations. This means that, when idle, the transistors are in a low leakage state and consume less power. They consume high power when necessary; i.e., when memory cell 10 is accessed for a read or write operation. With a biasing technique like this, power savings may be achieved, especially in embodiments where memory cells 10 are accessed only a small percentage of time, and remain in an idle state a majority of time.

As an example biasing scheme, refer back to FIG. 1. In FIG. 1, N-wells 40 and 41 can be similar in structure to one or more of the N-wells 58A, 58B, 66C, or 66D depicted in FIGS. 2-5, respectively. Also, P-wells 42-45 in FIG. 1 can be similar in structure to one or more of the P-wells 56A, 56B, 68C, or 68D depicted in FIGS. 2-5, respectively. Now consider a read operation in FIG. 1. Nodes 12 and 14 in memory cell 10 should be stable for a read operation, so that they are not unintentionally flipped to another state when memory cell 10 is read. Also, to improve the read speed (performance) of memory cell 10, it can be useful for access transistors 34 and 35 and pull-down transistors 32 and 33 to have a high drive current. To accomplish this, the wells for all the transistors can be forward biased to the full supply levels. That is, the N-wells 40 and 41 that contain the P-type pull-up transistors 30 and 31 can be biased to Vss, which is ground in certain embodiments. This reduces the threshold voltages of those transistors 30 and 31, thereby improving drive current and helping to stabilize nodes 12 and 14. At the same time, the P-wells 42-45 that contain N-type access transistors 34 and 35 and N-type pull-down transistors 32 and 33 can be forward biased to Vdd. This lowers the threshold voltage of those transistors, thus increasing drive current and improving the read speed of memory cell 10. Note also that when memory cell 10 is accessed for a read operation, word line 24 is also at Vdd. In certain other embodiments, one or more of the wells can be biased with one or more voltages other than Vss or Vdd. For example, bias voltages above Vdd or below Vss can be used.

Next, consider a write operation for memory cell 10. In a write operation, it can be advantageous for pull-up transistors 30 and 31 to be weak, so that nodes 12 and 14 can be easily flipped to the new state. Also, access transistors 34 and 35 can have high drive current so that the state of the cell can more easily be changed. When writing to one or more memory cells 10, N-wells 40 and 41 containing P-type pull-up transistors 30 and 31 can be zero-biased to Vdd, thereby weakening the pull-up transistors. P-wells 42-45 containing N-type access transistors 34 and 35 and N-type pull-down transistors 32 and 33 can be forward biased to Vdd, improving their performance and allowing easier write to memory cell 10. Note also that just as with a read operation, when memory cell 10 is accessed for a write operation, word line 24 is also at Vdd. In certain other embodiments, one or more of the wells can be biased with one or more voltages other than Vss or Vdd.

When memory cell 10 is in an idle state, high performance is not as critical, so it may be useful to keep the transistors in a low power state to reduce power consumption. In that case, it can be advantageous to not forward bias any of the transistors in memory cell 10. Accordingly, N-wells 40 and 41 containing P-type pull-up transistors 30 and 31 can be zero-biased to Vdd. Also, P-wells 42-45, which contain N-type access transistors 34 and 35 and N-type pull-down transistors 32 and 33, can be zero biased to Vss. In an idle state word line 24 is not selected, so it will also be at Vss. In certain other embodiments, one or more of the wells can be biased with one or more voltages other than Vss or Vdd.

In certain embodiments, word line 24 can be tied to one or more P-wells for biasing operations. As described above, in each of the three states of memory cell 10 (read, write, and idle), word line 24 may be at the same voltage as the one or more P-wells 42-45 that contain the N-type transistors. If that is the case, word line 24 and the one or more P-wells 42-45 can be electrically connected so that their voltages can be moved together.

Another technique to achieve power savings is to bias the wells without generating any intermediate voltages. As an example, some SRAM memory cells use a voltage Vdd and a voltage Vss (sometimes this is ground) for operation. It can be advantageous if the wells are biased by using only these two voltages, thus precluding the generation and distribution of intermediate voltages, a process which consumes power and could negate any power savings created by the biasing scheme. This is possible, for example, with certain types of low-power JFET devices.

Certain embodiments of this disclosure may also be useful for memory cells 10 at low voltages. In one non-limiting example, the forward bias voltage (which can be Vdd, Vss, or some other voltage) may be less than the voltage at which the parasitic diodes turn on.

Another technique is to only bias the N-wells 40 and 41 or P-wells 42-45 of the specific memory cells 10 being accessed. Physical constraints may make it difficult to bias one memory cell 10 at a time, but rows or columns of memory cells 10 could be biased together. In certain embodiments, if memory cells 10 are arranged in a row and column structure, only one row, and possibly only certain columns are being accessed for a given read or write operation. Therefore, the N-wells 40 and 41 and P-wells 42-45 can be constructed to contain only transistors from memory cells 10 in a certain row or column. That way, if only one row or column is being accessed, the transistors can be biased by biasing only one N-well and/or P-well. Similarly, biasing one well can improve the performance of an entire row or column, while having no effect on other rows or columns. Biasing the wells consumes some power, so power consumption can also be reduced by biasing the smallest number of wells necessary for any given operation. In other embodiments, more than one row or column may be biased at the same time.

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A memory cell, comprising:
   first and second access transistors, wherein the first access transistor is connected to a word line and connected between a first bit line and a first data node, and wherein the second access transistor is connected to the word line and connected between a second bit line and a second data node;
   first and second pull-up transistors, wherein the first pull-up transistor is connected to a first power supply point and to the first data node, and wherein the second pull-up transistor is connected to the first power supply point and the second data node;

first and second pull-down transistors, wherein the first pull-down transistor is connected to a second power supply point and to the first data node, and wherein the second pull-down transistor is connected to the second power supply point and to the second data node;

wherein the memory cell can perform a read operation, a write operation, or reside in an idle state;

wherein during a read operation the first and second pull-up transistors, the first and second pull-down transistors, and the first and second access transistors receive a forward bias voltage; and wherein during a write operation the first and second pull-up transistors receive a zero or reverse bias voltage, wherein receiving a zero or reverse bias voltage at the first and second pull-up transistors comprises zero or reverse biasing a well region of the first and second pull-up transistors to a voltage at the first power supply point and wherein the first and second pull-down transistors and the first and second access transistors receive a forward bias voltage.

2. The cell of claim 1, wherein when residing in an idle state the first and second pull-up transistors, the first and second pull-down transistors, and the first and second access transistors receive a zero bias voltage.

3. The cell of claim 1, wherein the first and second pull-up transistors are P-type devices residing in an N-well.

4. The cell of claim 3, wherein receiving a forward bias voltage at the first and second pull-up transistors comprises forward biasing the N-well of the first and second pull-up transistors to a voltage at the second power supply point.

5. The cell of claim 4, wherein biasing the N-well comprises biasing one or more rows or columns of memory cells.

6. The cell of claim 1, wherein the first and second pull-down transistors and the first and second access transistors are N-type devices residing in a P-well, the P-well further residing in an N-well.

7. The cell of claim 6, wherein receiving a forward bias voltage at the first and second pull-down transistors and the first and second access transistors comprises forward biasing the P-well of the first and second pull-down transistors and the first and second access transistors to a voltage at the first power supply point.

8. The cell of claim 7, wherein biasing the P-well comprises biasing one or more rows or columns of memory cells.

9. The cell of claim 2, wherein receiving a zero bias voltage at the first and second pull-down transistors and the first and second access transistors comprises zero-biasing a P-well of the first and second pull-down transistors and the first and second access transistors to a voltage at the second power supply point.

10. The cell of claim 1, wherein the second power supply point is zero volts.

11. The cell of claim 1, wherein the first power supply point is 0.5 volts.

12. The cell of claim 1, wherein the first and second pull-up transistors, the first and second pull-down transistors, and the first and second access transistors comprise JFET devices.

13. The cell of claim 12, wherein a threshold voltage of the JFET devices is between 0.2 volts and −0.2 volts when forward biased.

14. The cell of claim 6, wherein the P-well is connected to the word line.

* * * * *